United States Patent
Sato et al.

(10) Patent No.: US 10,253,219 B2
(45) Date of Patent: Apr. 9, 2019

(54) SPHERICAL CRYSTALLINE SILICA PARTICLES AND METHOD FOR PRODUCING SAME

(71) Applicant: NIPPON STEEL & SUMIKIN MATERIALS CO., LTD., Tokyo (JP)

(72) Inventors: Yutaka Sato, Tokyo (JP); Katsumasa Yagi, Himeji (JP); Mutsuhito Tanaka, Himeji (JP); Shozo Tokuda, Himeji (JP); Masanori Ae, Himeji (JP)

(73) Assignee: NIPPON STEEL & SUMIKIN MATERIALS CO., LTD., Tokyo (JP)

( * ) Notice: Subject to any disclaimer, the term of this patent is extended or adjusted under 35 U.S.C. 154(b) by 16 days.

(21) Appl. No.: 15/506,498

(22) PCT Filed: Aug. 25, 2015

(86) PCT No.: PCT/JP2015/073887
§ 371 (c)(1),
(2) Date: Feb. 24, 2017

(87) PCT Pub. No.: WO2016/031823
PCT Pub. Date: Mar. 3, 2016

(65) Prior Publication Data
US 2017/0267900 A1    Sep. 21, 2017

(30) Foreign Application Priority Data
Aug. 25, 2014    (JP) ................ 2014-170875

(51) Int. Cl.
| | |
|---|---|
| *C01B 33/18* | (2006.01) |
| *C03C 3/06* | (2006.01) |
| *C09J 11/04* | (2006.01) |
| *H01L 23/29* | (2006.01) |
| *H01L 23/00* | (2006.01) |
| *C08K 3/36* | (2006.01) |

(52) U.S. Cl.
CPC ............... *C09J 11/04* (2013.01); *C01B 33/18* (2013.01); *C01B 33/181* (2013.01); *C03C 3/06* (2013.01);
(Continued)

(58) Field of Classification Search
CPC .................. C01B 33/18; C03C 3/06
(Continued)

(56) References Cited

U.S. PATENT DOCUMENTS

| | | | |
|---|---|---|---|
| 4,853,198 A | 8/1989 | Orii et al. | |
| 5,096,857 A | 3/1992 | Hu et al. | |

FOREIGN PATENT DOCUMENTS

| | | |
|---|---|---|
| JP | 63-233008 A | 9/1988 |
| JP | 2-22119 A | 1/1990 |

(Continued)

OTHER PUBLICATIONS

Higuchi et al., "Effect of Alkali Metal Oxide Addition on Crystalization and Phase Transformation of Sintered Spherical Silica," Journal of the Ceramic Society of Japan, vol. 105, No. 5, 1997, pp. 385-390, with an English abstract.
(Continued)

*Primary Examiner* — Hoa (Holly) Le
(74) *Attorney, Agent, or Firm* — Birch, Stewart, Kolasch & Birch, LLP (57) ABSTRACT

Spherical crystalline silica particles having a higher productivity, lower production cost, higher coefficient of thermal expansion, higher heat transmission rate, higher fluidity, higher dispersability, higher fill factor, low abrasiveness, and higher purity compared with the past and able to be applied in the semiconductor field and a process of production of the same are provided. Spherical crystalline silica particles containing 400 to 5000 ppm of aluminum and containing 80% or more of crystal phases are provided.

9 Claims, 3 Drawing Sheets

(52) U.S. Cl.
CPC .......... *H01L 23/295* (2013.01); *H01L 23/562* (2013.01); *C01P 2004/03* (2013.01); *C01P 2004/32* (2013.01); *C01P 2004/61* (2013.01); *C01P 2006/80* (2013.01); *C08K 3/36* (2013.01)

(58) Field of Classification Search
USPC ............................................ 423/355; 501/54
See application file for complete search history.

(56) References Cited

FOREIGN PATENT DOCUMENTS

| | | | |
|---|---|---|---|
| JP | 4-292440 | A | 10/1992 |
| JP | 10-251042 | A | 9/1998 |
| JP | 2001-172472 | A | 6/2001 |
| JP | 2002-154818 | A | 5/2002 |
| JP | 2005-231973 | A | 9/2005 |
| JP | 2008-162849 | A | 7/2008 |
| JP | 2012-102016 | A | 5/2012 |
| JP | 5062396 | B2 | 10/2012 |
| JP | 2015-44939 | A | 3/2015 |
| JP | 2015-44940 | A | 3/2015 |

OTHER PUBLICATIONS

International Search Report (Form PCT/ISA/210) for International Application No. PCT/JP2015/073887, dated Nov. 2, 2015.
Nukui, "Polymorphism of Silica," Bulletin of the Ceramic Society of Japan, vol. 20, No. 4, 1985, pp. 266-273.

FIG. 1

SCAN TYPE ELECTRON MICROGRAPH OF SPHERICAL SILICA PARTICLES
(INVENTION EXAMPLE) BEFORE AND AFTER HEAT TREATMENT (HOLDING)

FIG. 2

SCAN TYPE ELECTRON MICROGRAPH OF SPHERICAL SILICA PARTICLES
(COMPARATIVE EXAMPLE) BEFORE AND AFTER HEAT TREATMENT (HOLDING)

FIG. 3

SPHERICAL CRYSTALLINE SILICA PARTICLES AND METHOD FOR PRODUCING SAME

TECHNICAL FIELD

The present invention relates to spherical crystalline silica particles and a process of production of the same.

BACKGROUND ART

Silica particles are used as resin fillers. For example, they are used as fillers for sealants of semiconductor devices. If the silica particles are shaped with angles, the fluidity, dispersability, and fill factor in the resin will become poor and, further, the manufacturing apparatus will become increasingly worn. To deal with this, spherical silica particles are broadly used.

In general, flame spraying is used as the method for producing spherical silica. With flame spraying, the particles are passed through a flame so that the particles melt and become spherical in shape due to surface tension. The melted particles made spherical are prevented from melt fusing with each other by conveying them and recovering them by a flow of gas, but the flame sprayed particles are rapidly cooled. Since the particles are rapidly cooled from the molten state, the silica does not contain much crystals and is amorphous in structure.

Since the spherical silica is amorphous, its coefficient of thermal expansion and thermal conductivity are low. The coefficient of thermal expansion of amorphous silica is 0.5 ppm/K, while the thermal conductivity is 1.4 W/mK. These physical properties are generally equal to the coefficient of thermal expansion of quartz glass not having a crystal structure, but having an amorphous structure.

A sealant filled with a high amount of amorphous silica with a low coefficient of thermal expansion is extremely low in coefficient of thermal expansion, so warping or cracks sometimes occur due to the heating temperature at the time of reflow or the operating temperature of the semiconductor devices. Further, due to the low thermal conductivity, dissipation of the heat generated from semiconductor devices is also becoming a problem.

On the other hand, as crystalline structures of silica, there are cristobalite, quartz, tridymite, etc. Silica having these crystal structures are known to have higher coefficients of thermal expansion and thermal conductivities than amorphous silica. For these reasons, various methods have been proposed for crystallizing amorphous spherical silica to raise the coefficient of thermal expansion (PLTs 1 and 2).

One of the conventional means for crystallizing amorphous silica is heat treatment of high purity amorphous silica at a high temperature followed by gradual cooling so as to promote crystallization. PLT 3 proposes to heat spherical amorphous silica at a 1200 to 1600° C. high temperature for 5 to 24 hours to make the crystals reliably grow, then slowly cool them over 20 to 50 hours down to room temperature to cause formation of cristobalite.

Further, NPLT 1 reports on the effects on crystallization and phase transition of the addition of 0.5 to 7.0 mass % of an alkali metal oxide to amorphous spherical silica and sintering the same. In the case of no addition, no crystal phases could be observed in the sintered silica. The greater the amount of addition and the higher the sintering temperature, the more crystallization was promoted.

CITATION LIST

Patent Literature

PLT 1: Japanese Patent Publication No. 2012-102016A
PLT 2: Japanese Patent Publication No. 10-251042A
PLT 3: Japanese Patent Publication No. 2001-172472A
Nonpatent Literature
NPLT 1: Masafumi Higuchi et al., *J. Ceramic Society of Japan*, 105, [5], 385-390 (1997), Effects of Alkali Metal Oxides in Crystallization and Phase Transition Accompanying Sintering of Amorphous Silica

SUMMARY OF INVENTION

Technical Problem

Use of semiconductor products is being sought in various environments. In particular, avoidance of warping and cracking etc. when utilized in a high temperature environment is being sought. In this case, spherical crystalline silica is useful as a filler with a high coefficient of thermal expansion and thermal conductivity.

One of the methods for obtaining spherical crystalline silica is to perform heat treatment on high purity amorphous silica at a high temperature, then gradually cool it to thereby promote crystallization (PLT 3). However, at the time of heat treatment at a high temperature of 1200 to 1600° C., there was the problem that the silica particles would fuse or sinter with each other thereby causing them to aggregate. Further, for reliable crystallization, the heat treatment is performed for 24 hours, then cooled slowly over 20 to 50 hours down to room temperature, so the productivity was low and the production cost was high.

Note that PLT 1 proposes to pass a silica sol dispersion through microbores to obtain a spherical emulsion, then gel and heat-treat it to obtain crystalline silica. The method of PLT 1 adds the steps of separating and drying the emulsion, so the productivity is low. Further, expensive silica sol is used as a starting material, so the production cost also becomes higher. Further, while spherical crystallized silica particles made by flame-spraying process are dense, the products made by the method of PLT 1 have the problem that pores easily remain inside the particles.

PLT 2 proposes silica filler powder comprised of crystalline silica particles on the surface of which a coating made of an aluminum oxide-based ceramic is formed. With this process, amorphous silica particles are mixed with alumina powder, mullite powder, or other aluminum oxide-based ceramic powder, then the mixed powder is fired (5 to 20 hours at 1300 to 1600° C.) whereby the amorphous silica particles crystallize and form crystalline silica particles mainly comprised of cristobalite. Further, fine powder sticks to the particle surfaces therefore forming a coating. With the method of PLT 2 as well, there is a similar problem as with PLT 3 in the point of crystallization by high temperature and long time period heat treatment. Note that the coating made of the aluminum oxide-based ceramic is provided in anticipation of a buffering effect easing the difference in expansion with use mixed with glass powder or another material with a different coefficient of thermal expansion.

NPLT 1 reports that when adding 0.5 to 7.0 mass %, converted to oxides, of an alkali metal carbonate to amorphous spherical silica and firing the result, the greater the amount of addition and the higher the firing temperature, the more crystallization is promoted. However, with a semiconductor sealant, a high purity is required. Addition of 0.5 mass % (5000 ppm) or more of an alkali metal oxide is unacceptable. Even if, in accordance with the teaching of NPLT 1, adding 0.5 mass % or more, converted to oxides, of an alkali metal to the spherical silica particles, the high concentration alkali metal oxide would cause the melting point to drop and result in melt fusing or sintering of the spherical silica particles and, as shown in the SEM photograph of NPLT 1, make it impossible to hold the shape of the spherical silica particles. Further, when mixing the spherical silica particles as a filler in a semiconductor sealant, they may obstruct curing of the resin and thereby prevent the sealant from solidifying.

The present invention has as its object the provision of spherical crystalline silica particles higher in productivity and lower in manufacturing cost compared with the past, having a high coefficient of thermal expansion and high thermal conductivity, and being spherical, so having a high fluidity, high dispersability, and high fill factor and able to be applied in the semiconductor field as well and the provision of a process of production of the same.

Solution to Problem

According to the present invention, the following are provided:

[1] Spherical crystalline silica particles containing 400 to 5000 ppm of aluminum and containing 80% or more of crystal phases.
[2] The spherical crystalline silica particles according to [1], containing 90% or more of crystal phases.
[3] The spherical crystalline silica particles according to [1] or [2], wherein 95 to 100% of the crystal phases are cristobalite crystal phases.
[4] The spherical crystalline silica particles according to any one of [1] to [3], wherein the cristobalite crystal phases have a phase transition start temperature of 220 to 245° C.
[5] The spherical crystalline silica particles according to any one of [1] to [4], wherein an average particle size (D50) is 1 to 100 μm.
[6] The spherical crystalline silica particles according to any one of [1] to [5], containing 300 ppm or less, converted to metal, of an alkali ingredient.
[7] The spherical crystalline silica particles according to any one of [1] to [6], containing 20 to 300 ppm, converted to metal, of an alkali ingredient.
[8] A process of production of spherical crystalline silica particles comprising: preparing silica powder so as to contain 400 to 5000 ppm of aluminum,
flame spraying the prepared silica powder, holding the flame sprayed spherical silica particles at 1100 to 1600° C. for 1 to 12 hours, and
cooling the spherical silica particles to have 80% or more of crystal phases.
[9] The process of production according to [8], wherein the flame sprayed spherical silica particles have an average particle size (D50) of 1 to 100 μm.
[10] The process of production according to any one of [8] and [9], comprising preparing the silica powder so as to contain 300 ppm or less, converted to metal, of an alkali ingredient.
[11] The process of production according to any one of [8] to [10], comprising preparing the silica powder so as to contain 20 to 300 ppm, converted to metal, of an alkali ingredient.

Advantageous Effects of Invention

According to the present invention, there are provided spherical crystalline silica particles which are high in crystallization ratio, so have a high coefficient of thermal expansion and a high heat transmission rate and which are spherical, so have a high fluidity, high dispersability, and high fill factor, and can be applied in the field of semiconductors as well. Further, according to the present invention, there is provided a process of production of the spherical crystalline silica particles which is higher in productivity and lower in production cost than a conventional process of production of silica particles.

DESCRIPTION OF EMBODIMENTS

The inventors engaged in in-depth studies for solving the above problem and as a result discovered that with a process of production of spherical crystalline silica particles comprising mixing aluminum with a starting material of powder of silica particles to make the starting material contain 400 to 5000 ppm of aluminum and flame spraying that starting material, surprisingly even if treating the obtained silica particles by the heat treatment required for subsequent crystallization under conditions gentler than the past, that is, treating them by a heat treatment temperature of a lower temperature of 1100° C. to 1600° C. and treating them by a heat treatment time period of a shorter time period of 1 to 12 hours, the ratio of crystal phases in the obtained spherical silica particles can be made 80% to 100% and the productivity can be raised and the manufacturing cost lowered compared with the conventional process of production of silica particles. Furthermore, they discovered that due to the thus produced "spherical crystalline silica particles containing 400 to 5000 ppm of aluminum and containing 80% or more of crystal phases", spherical crystalline silica particles can be realized which have a high crystallization ratio, so have a high coefficient of thermal expansion and high thermal conductivity and which are spherical, so have a high fluidity, high dispersability, high filling property, and low abrasiveness and can be applied even in the semiconductor field.

The silica particles of the present invention contain 400 to 5000 ppm of aluminum. By including 400 to 5000 ppm of aluminum in the starting material powder of silica particles, crystallization of the silica is realized by heat treatment (holding) at a temperature range of 1100 to 1600° C. for 1 to 12 hours and then cooling. The conventional crystallization method such as described in PLT 3 comprised heat treatment at a high temperature of 1200 to 1600° C. for up to 24 hours, then slow cooling down to room temperature over 20 to 50 hours. That is, in the process of production of the present invention, the heat treatment can be made at a lower temperature than the past. The heat treatment can also be made within a shorter time (period) than the past. Further, the cooling time period of the present invention is not particularly limited. Even with rapid cooling, the crystallization ratio will not fall. For these reasons, no special step is required for cooling. The actual operating conditions can be applied as they are. For example, the cooling time period may be from tens of minutes to about 20 hours or less than that. Therefore, the silica particles of the present invention are higher in productivity and lower in production cost than the past.

While not constrained by any specific theory, aluminum is believed to act as a crystal nuclei forming agent at the time of heat treatment (holding). Further, alumina obtained by oxidation of aluminum can be expected to have an effect in improving the chemical durability (acid resistance etc.) of silica particles. If the content of aluminum is less than 400 ppm, the crystallization promoting effect and the chemical durability improving effect are sometimes not sufficient. To raise the crystallization promoting effect and chemical durability improving effect, the lowest limit of the aluminum content may be 410 ppm, preferably 420 ppm, more preferably 430 ppm, still more preferably 440 ppm, more preferably 450 ppm, still more preferably 460 ppm, more preferably 470 ppm, still more preferably 480 ppm, more preferably 490 ppm, still more preferably 500 ppm, more preferably 510 ppm, still more preferably 520 ppm, still more preferably 530 ppm, more preferably 540 ppm, still more preferably 550 ppm. On the other hand, aluminum or alumina is known to be effective in lowering the melting point of silica. For example, the melting point of alumina silica glass is lower than the melting point of pure silica glass. For these reasons, if the content of aluminum exceeds 5000 ppm, the silica particles will fall in melting point and the silica particles will easily aggregate due to melt fusion or sintering during the heat treatment (holding). If the particles proceed to aggregate with each other, when used as a semiconductor sealant-use filler etc., the fluidity, dispersability, and fill factor will not be sufficient or abrasion of the sealant manufacturing equipment will be promoted. Further, in a semiconductor sealant, generally a high purity is required. Adding 5000 ppm or more of aluminum is sometimes not suitable. To avoid a drop in the melting point, the maximal value of the aluminum content may be 4500 ppm, preferably 4000 ppm, more preferably 3500 ppm, still more preferably 3000 ppm, more preferably 2500 ppm, more preferably 2000 ppm, still more preferably 1500 ppm, more preferably 1000 ppm. The content of aluminum can be measured by, for example, the atomic absorption spectrometry method or ICP mass spectrometry (ICP-MS). Preferably, the atomic absorption spectrometry method is used.

The silica particles of the present invention contain 80% or more of crystal phases. The coefficient of thermal expansion of the amorphous silica is 0.5 ppm/K, while the thermal conductivity is 1.4 W/mK. As opposed to this, crystalline silica, while differing depending on the crystal structure, has a higher coefficient of thermal expansion and thermal conductivity than amorphous silica. Specifically, quartz has a coefficient of thermal expansion of 14 ppm/K and a thermal conductivity of 6.6 W/mK. Cristobalite and tridymite have coefficients of thermal expansion of 20 to 34 ppm/K and thermal conductivities of 10 W/mK. The crystal phases of the silica particles of the present invention may be at least one of cristobalite, quartz, and tridymite. Therefore, the crystalline silica particles of the present invention are high in crystallization ratio, so have a higher coefficient of thermal expansion and thermal conductivity than amorphous silica. When using silica particles as a filler for a semiconductor sealant etc., since a large current flows through the semiconductor devices, the semiconductor devices generate large heat. Crystalline silica with its high thermal conductivity is useful for dissipating this heat. Further, along with the generation of heat by the semiconductor devices, the semiconductor sealant sometimes expands due to the heat and contracts and sometimes cracks or warps. The crystalline silica of the present invention is high in coefficient of thermal expansion, so does not easily crack or warp. If containing less than 80% crystal phases, sometimes the coefficient of thermal expansion and thermal conductivity of the silica particles will not be sufficiently high. Furthermore, if containing 90% or more of crystal phases, this is advantageous for reducing the cracking or warping of the semiconductor sealant, so the ratio of the crystal phases is preferably 90% or more.

The ratios of the crystal phases can for example be measured by X-ray diffraction (XRD). When measured by XRD, the ratios can be calculated by the following equation from the sum of integrated intensities of crystalline peaks (Ic) and integrated intensities (Ia) of the halo parts of the amorphous component.

$$X \text{ (ratio of crystal phases)} = Ic/(Ic+Ia) \times 100(\%)$$

Further, at the crystal phases of silica particles, cristobalite has a larger heat expansion compared with quartz or tridymite, so is effective for reducing the cracking and warping of a semiconductor sealant. This is because when cristobalite changes in phase from the $\alpha$ phase to the $\beta$ phase at 220 to 245° C., it greatly expands in volume along with the change in crystal structure. For these reasons, preferably 95 to 100% of the crystal phases are crystal phases of cristobalite.

The ratios of the various types of crystal phases in the crystal phases contained in the silica particles can be measured by XRD. For example, it is possible to use the peak data of PDF33-1161 for quartz, PDF11-695 for cristobalite, and PDF18-1170 for tridymite to calculate the ratios of the respective crystal phases from the ratios of the sums of integrated intensities of the peaks or ratios of the sums of the peak intensities. Further, as a simpler method, it is possible to calculate the ratios of the crystal phases from the ratios of intensities of the peak of the maximum intensity of quartz (101 plane, d=3.342), the peak of the maximum intensity of cristobalite (101 plane, d=4.05), and the peak of the maximum intensity of tridymite (211 plane, d=4.107). Further, the peak positions of the maximum intensities of cristobalite and tridymite are close, so the peaks may be separated to calculate the intensities or the peaks of the second or later intensities may be corrected based on the intensity ratio of the pdf data and used for the calculations.

Further, the silica particles of the present invention preferably have a phase transition start temperature of 220 to 245° C. This is because if phase transition occurs at this temperature, the coefficient of thermal expansion of the cristobalite greatly changes and the effect of reducing warping or cracking is obtained.

If the phase transition starting temperature is lower than 220° C., the change of the coefficient of thermal expansion of cristobalite is small and the effect of reducing the warping and cracking becomes harder to obtain. Further, if the phase transition start temperature is higher than 245° C., the change of the coefficient of thermal expansion is large, but heat expansion occurs at a temperature higher than the temperature where the resin cures, so the effect of reducing the warping and cracking becomes harder to obtain.

The phase transition start temperature can be measured by a differential thermal analyzer (DTA). The phase transition of cristobalite appears as an endothermic peak, so the extrapolated start temperature of the endothermic peak can be measured as the phase transition start temperature.

The silica particles of the present invention are spherical. The means for making them spherical are not particularly limited. Pulverization, polishing, or other means may also be used. In particular, the means of flame spraying before crystallization enables formation into spheres with a high productivity and by a low cost. When the spherical silica particles are used as a filler for a semiconductor sealant etc., the fluidity, dispersability, and fill factor are high. Further, abrasion of the sealant manufacturing equipment can also be suppressed.

The silica particles of the present invention may have an average particle size (D50) of 1 to 100 μm. If the average particle size exceeds 100 μm, when used as a filler for a semiconductor sealant etc., sometimes the particle size will be too coarse and gate clogging or mold abrasion will easily be caused. Further, since the particle size is large, the particles as a whole will be harder to crystallize. For these reasons, the size is preferably made 50 μm or less. Further, if the average particle size is less than 1 μm, the particles will become too fine, that is, the surface area ratio of the particles will become larger, the particles will easily aggregate by melt fusion or sintering, and filling a large amount will sometimes no longer be possible. More preferably, particles with an average particle size of 3 μm or more are used. When using heat treatment to cause crystallization, a higher temperature enables the crystallization to proceed more in degree and enables crystalline spherical particles with better characteristics to be obtained, but at such a high temperature, particles with an average particle size of less than 3 μm will easily agglomerate and lead to a drop (decline) in the circularity. If using particles of 3 μm or more size, crystallization is possible without agglomeration even at a temperature where crystallization sufficiently proceeds in degree.

Note that, the "average particle size" here can be found, for example, by measurement of the distribution of particle size etc. by laser diffraction. The distribution of particle size found by laser diffraction can be measured for example by a CILAS920 made by CILAS. The "average particle size" referred to here is called the "median size". Laser diffraction or another method is used to measure the particle size distribution, and the particle size where the cumulative frequency of particle size becomes 50% is made the average particle size (D50).

To obtain the above range of particle size, it is possible to adjust the particle size of the starting material silica particles (particles before crystallization). If using the above-mentioned flame spraying means, it is possible to easily adjust the particle size. In other words, the average particle size of the silica particles of the present invention does not change much at all before and after the heat treatment (holding) for crystallization. Amorphous silica particles sometimes aggregate with each other due to the particles softening at 1100 to 1600° C. or so and melt fusing or sintering, but the silica particles of the present invention are made crystalline at 1100 to 1600° C. They do not soften like amorphous particles, so aggregation due to melt fusion or sintering at about 1100 to 1600° C. is sufficiently suppressed. In particular, aggregation of particles with each other due to melt fusion or sintering occurs more easily the larger the surface area ratio of the particles, that is, the smaller the particle size. However, the silica particles of the present invention are crystalline, so even if the average particle size is 1 μm, there is no aggregation due to melt fusion or sintering and agglomeration is difficult. Therefore, when using the silica particles of the present invention as a filler for a semiconductor sealant etc., the fluidity, dispersability, and fill factor (filling performance) are high and abrasion of the sealant manufacturing equipment can also be suppressed.

The spherical silica particles of the present invention have a circularity of 0.88 or more. The circularity in the present invention is conveniently and preferably measured by a commercially available flow type particle image analyzer. Further, relatively large particles can be found as follows from a micrograph of an optical microscope while relatively small particles can be found from a scan type electron microscope (SEM) or other micrograph using image analysis processing software. Photographs are taken of samples of at least 100 silica particles, then the respective silica particles (2D projections) are measured for area and perimeter. It is assumed that the silica particles are true circles and the circumferences of true circles having the measured areas are calculated. The circularity is found by the equation of circularity=circumference/perimeter. A circularity=1 is a true circle. That is, the closer the circularity to 1, the closer it is considered the shape is to a true circle. The average of the circularities of the particles found in this way is calculated and used as the circularity of the particles of the present invention. If the circularity is less than 0.88, when used as a semiconductor sealant-use filler etc., sometimes the fluidity, dispersability, and fill factor will not be sufficient or abrasion of the sealant manufacturing equipment will be promoted.

To obtain this circularity, it is possible to adjust the circularity of the starting material silica particles (particles before crystallization). If using the above-mentioned flame spraying means, it is possible to easily obtain particles with a high circularity. Further, the circularity of the silica particles of the present invention hardly declines before and even after heat treatment (holding) for crystallization. The silica particles of the present invention include 400 to 5000 ppm of aluminum, whereby they are made crystalline at 1100 to 1600° C. In this temperature range, the circularity does not fall much at all. Further, amorphous silica particles sometimes aggregate due to melt fusion or sintering at 1100 to 1600° C. or so, but the silica particles of the present invention are made crystalline at 1100 to 1600° C. due to containing 400 to 5000 ppm of aluminum (since already not amorphous), so are sufficiently kept from aggregating due to melt fusion or sintering at 1100 to 1600° C. or so. If aggregating, the circularity falls, but the silica particles of the present invention are sufficiently kept from aggregating, so the circularity does not fall much at all. Therefore, when utilized as a filler for a semiconductor sealant etc., the silica particles of the present invention are high in fluidity, dispersability, and fill factor and can also suppress abrasion of the sealant manufacturing equipment.

Further, the spherical crystalline silica particles of the present invention can be mixed with a resin for use as a sealant for a semiconductor etc., but preferably an alkali ingredient is not contained in the particles too much. This is because if the alkali ingredient is large, it will obstruct curing of the resin and when used as a sealant for a semiconductor, corrosion will occur and the performance of the semiconductor will be degraded. Further, if over 300 ppm of the alkali ingredient is contained, the softening temperature of the particles will fall at the time of heat treatment (holding) for crystallization, so the particles will stick with each other and cause the circularity to fall. For these reasons, the amount of alkali contained in the silica particles is preferably 300 ppm or less. Further, an alkali ingredient being contained results in the effect of crystallization being promoted, so the spherical crystalline silica particles of the present invention may contain 20 to 300 ppm of alkali ingredient. With less than 20 ppm of alkali ingredient, the degree of crystallization becomes lower compared with the case of containing 20 ppm or more of alkali ingredient, so containing 20 ppm or more of alkali ingredient is desirable.

As the alkali ingredient, an element other than hydrogen in the elements of Group I of the Periodic Table such as lithium, sodium, potassium, rubidium, cesium, and francium may be mentioned.

The content of the alkali ingredient may be measured, for example, by the atomic absorption spectrometry method or ICP mass spectrometry (ICP-MS).

The process of production of the present invention will now be explained. The spherical crystalline silica particles of the present invention can be produced by a process including the following steps:

That is, the process of production of the present invention comprises
preparing silica powder so as to contain 400 to 5000 ppm of aluminum converted to metal aluminum,
flame spraying the prepared silica powder,
heat treating (holding) the flame sprayed spherical silica particles at 1100 to 1600° C. for 1 to 12 hours, and cooling the heat treated (held) spherical silica particles. Further, the spherical crystalline silica particles produced by this process has 80% or more of crystal phases.

The starting material, that is, the silica powder, may be amorphous or may be crystalline. Further, the silica powder may be porous or nonporous. The silica powder may contain aluminum or an aluminum compound as an impurity. The silica powder is prepared so that aluminum is contained in an amount of 400 to 5000 ppm while considering the amount of aluminum contained as an impurity. The lower limit value of the aluminum content is 410 ppm, preferably 420 ppm, more preferably 430 ppm, still more preferably 440 ppm, more preferably 450 ppm, still more preferably 460 ppm, more preferably 470 ppm, still more preferably 480 ppm, more preferably 490 ppm, still more preferably 500 ppm, more preferably 510 ppm, still more preferably 520 ppm, still more preferably 530 ppm, more preferably 540 ppm, still more preferably 550 ppm. The upper limit value of the aluminum content is 4500 ppm, preferably 4000 ppm, more preferably 3500 ppm, still more preferably 3000 ppm, more preferably 2500 ppm, more preferably 2000 ppm, still more preferably 1500 ppm, more preferably 1000 ppm. Aluminum may be added to prepare the powder. As the aluminum added, an aluminum compound may also be used.

As the added aluminum or aluminum compound, metal aluminum, aluminum oxide, aluminum hydroxide, aluminum nitrate, aluminum oxalate, alumina sol, aluminum isopropoxide and other aluminum alkoxides etc. may be used. When adding a flame sprayed aluminum or aluminum compound, it is desirable to mix it uniformly with the silica particles so that it is uniformly taken into the silica particles at the time of flame spraying, so it is preferably added and mixed in as a powder finer than the silica powder or rendered an aqueous solution or other solution which is then mixed with the silica powder. Further, the aluminum can also be added by the method of performing the step of pulverizing the starting material silica powder to adjust the particle size by a ball mill using alumina balls so as to make abraded powder of the alumina balls mixed in with the silica powder.

The particle size of the silica powder is suitably adjusted in accordance with the preparation and flame spraying step since the powder is prepared and flame sprayed. Further, the silica powder used can be one with an average particle size (D50) of 1 to 100 μm. When using silica powder with an average particle size (D50) smaller than 1 μm, the particles end up agglomerating and sometimes the feed of material becomes difficult at the time of flame spraying. Further, if flame sprayed in the agglomerated state, the particles sometimes end up melting and being made spherical in the agglomerated state, so particles larger than the targeted particles end up being formed. When using silica powder with an average particle size (D50) larger than 100 μm, as explained before, sometimes the gate becomes clogged or mold abrasion is easily caused. Still more preferably, it is 3 to 100 μm, further preferably, 3 to 50 μm.

Silica powder prepared so as to contain 400 to 5000 ppm of aluminum is flame sprayed to obtain spherical silica particles. With flame spraying, the particles are passed through a flame so that the particles melt and become spherical in shape due to surface tension. Further, through this flame spraying step (melting), the aluminum contained in the prepared silica powder diffuses into the silica particles. Aluminum is believed to act as a crystal nuclei forming agent at the time of the following heat treatment (holding) step. By diffusing in the silica particles, uniform crystal growth is realized at a lower temperature and shorter time period than the past.

The particles after flame spraying may be treated to be rapidly cooled so that the melted particles made spherical do not melt fuse with each other. In this case, since the spherical silica particles are rapidly cooled from the melted state, they may also not have crystal structures but may have amorphous structures. The spherical silica particles are flame sprayed, so may also be nonporous. Nonporous spherical silica particles are dense so the thermal conductivity is expected to become higher.

Silica powder prepared so that the alkali ingredient becomes 300 ppm or less in addition to the above 400 to 5000 ppm of aluminum may also be prepared. If the alkali ingredient contains over 300 ppm, the softening temperature of the particles falls at the time of heat treatment (holding) for crystallization, so the particles stick to each other and the circularity ends up being made to fall. For these reasons, the amount of alkali contained in the silica powder is preferably 300 ppm or less.

Further, an alkali ingredient being contained results in the effect of crystallization being promoted, so the silica powder may be prepared so as to contain 20 to 300 ppm of alkali ingredient. With less than 20 ppm of alkali ingredient, the degree of crystallization becomes lower than the case of containing 20 ppm or more of alkali ingredient, so containing 20 ppm or more of alkali ingredient is preferable.

The spherical silica particles obtained by the flame spraying may have an average particle size (D50) of 1 to 100 μm. The following heating and cooling steps for crystallization have a maximum temperature of 1600° C. or so, therefore the spherical silica particles do not change much at all in particle size. Further, with a flame spraying means, it is possible to easily adjust the particle size. For these reasons, in the process of the present invention, spherical crystalline silica particles with the desired average particle size can be easily realized.

The spherical silica particles obtained by the flame spraying have a circularity of 0.88 or more. The following heating and cooling steps for crystallization have a maximum temperature of 1600° C. or so, therefore the spherical silica particles do not change much at all in circularity. Further, with a flame spraying means, it is possible to easily obtain particles with a high circularity. For these reasons, in the process of the present invention, spherical crystalline silica particles with the desired high circularity can be easily realized. To make the circularity of the spherical silica particles obtained by flame spraying 0.88 or more, it is necessary to render the starting material silica powder a molten state to make it spherical, so the temperature of the flame at the time of flame spraying has to be made higher than the temperature at which silica melts. To obtain spherical silica with a high circularity, the temperature of the flame is preferably 2000° C. or more.

Further, if the silica particles contact each other at the time of flame spraying, the particles will easily aggregate with each other and form distorted shapes, so it is preferable to supply the starting material into the flame while dispersing the starting material in a flow of gas or adjusting the amount of feed.

The flame sprayed spherical silica particles are heat treated (held) at 1100 to 1600° C. for 1 to 12 hours, then the heat treated (held) spherical silica particles are cooled to obtain spherical crystalline silica particles. The cooling time period is not particularly limited. The flame sprayed spherical silica particles can be grown evenly and at a lower temperature and a shorter time period than in the past due to the alumina, which is considered to act as a crystal nuclei forming agent, diffusing into the silica particles.

Further, the combination of the temperature and time period is suitably set considering the crystallization ratio and circularity of the desired silica particles. In general, as the heat treatment (holding) time period is made longer or the heat treatment (holding) temperature is made higher, the crystallization ratio becomes higher. With treatment at a low temperature for a short time period, the ratio of content of the crystal phases sometimes ends up becoming less than 80%. Further, when performing heat treatment (holding) at a high temperature, if making the heat treatment (holding) time period longer, the particles bond with each other and sometimes the circularity becomes less than 0.88. For these reasons, to obtain the spherical crystalline silica particles according to the present invention, it is preferable to adjust the combination of the heat treatment (holding) temperature and heat treatment (holding) time period by the amount of impurities and particle size of the starting materials. To raise the crystallization ratio, the lower limit value of the heat treatment (holding) time period may be made 2 hours, preferably 3 hours, more preferably 4 hours, still more preferably 5 hours. Further, the lower limit value of the heat treatment (holding) temperature may be made 1150° C., preferably 1200° C., more preferably 1250° C., still more preferably 1300° C. Further, to avoid a drop in the circularity, the upper limit value of the heat treatment (holding) time period may be made 11 hours, preferably 10 hours, more preferably 9 hours, still more preferably 8 hours. Further, the upper limit value of the heat treatment (holding) temperature may be made 1550° C., preferably 1500° C., more preferably 1450° C., still more preferably 1400° C.

Further, as explained above, the silica particles of the present invention are highly effective when the phase transition start temperature is 220 to 245° C. The heat treatment (holding) temperature and the heat treatment (holding) time period can be adjusted to obtain silica particles with a phase transition start temperature of this temperature range.

The cooled spherical crystalline silica particles have 80% or more of crystal phases. The crystalline silica particles are high in crystallization ratio, so have a higher coefficient of thermal expansion and thermal conductivity than amorphous silica. When utilizing silica particles as filler for a semiconductor sealant etc., crystalline silica with a high thermal conductivity is useful for dissipating the large heat of the semiconductor devices. Further, along with the generation of heat by the semiconductor devices, the semiconductor sealant expands by heat and contracts resulting in cracks and warping in some cases, but the obtained crystalline silica is high in coefficient of thermal expansion, so is resistant to cracking and warping.

EXAMPLES

Below, working examples and comparative examples will be shown to explain the present invention in more detail. However, the present invention is not interpreted limited to the following working examples.

Working Example 1

Starting silica powder of the average particle size and impurity contents of Table 1 was flame sprayed to prepare spherical silica particles. The obtained spherical silica particles were raised in temperature in the atmosphere by a temperature elevation rate of 200° C./hr until 1300° C., were held at 1300° C. for 6 hours, then were cooled to ordinary temperature at a temperature descent rate of 200° C./hr. The circularity and crystallization ratio of the obtained silica particles were found and shown in Table 2.

The circularity was measured using a flow type particle image analyzer "FPIA-3000" made by Sysmex. The circularity measured using a microscope was the same as the circularity found by flow analysis.

The crystallization ratio was obtained by using X-ray diffraction to find the integrated area of the amorphous peaks and crystalline peaks. The ratio of the crystalline area was made the crystallization ratio. That is, the crystallization ratio was calculated as the integrated area of the crystalline peaks/(integrated area of amorphous peaks+integrated area of crystalline peaks). The average particle sizes (D50) of the starting material and after heat treatment (holding) were measured using a laser diffraction type particle size distribution measuring device (CILAS 920 made by CILAS). Further, "D50", which is also called the median diameter, is the particle size where the cumulative wt % becomes 50%. The impurity contents of the starting material and after heat treatment (holding) were measured by heating and breaking down a sample by acid and measuring the obtained sample aqueous solution by the atomic absorption spectrophotometry.

Further, the specific surface area was measured using a Tristar II made by Micromeritics by the BET method. The crystallization ratio was measured by using RINT-TTRIII made by Rigaku for the XRD apparatus under conditions of a Cu tube, tube voltage 50 kV, tube current 300 mA, divergence slit ½°, scattering slit 8 mm, light receiving slit 13 mm, scan speed 2°/min, and sampling width 0.01°.

TABLE 1

Composition of Starting Silica Powder Etc.

| No. | | Working example A | Comparative example B |
|---|---|---|---|
| Average particle size (D50) | μm | 11 | 11 |
| Impurity contents | | | |
| Al | ppm | 2450 | 70 |
| Fe | ppm | 73 | 12 |
| Ca | ppm | 49 | 5.7 |
| Mg | ppm | 37 | 1.2 |

TABLE 1-continued

Composition of Starting Silica Powder Etc.

| No. | | Working example A | Comparative example B |
|---|---|---|---|
| Na | ppm | 36 | 9.6 |
| K | ppm | 61 | 9.1 |
| Alkali metal total | ppm | 97 | 18.7 |
| Circularity | | 0.98 | 0.97 |
| Specific surface area | m$^2$/g | 0.21 | 0.19 |

TABLE 2

Composition of Silica Particles Etc. After Heat Treatment (Holding)

| No. | | Working example A | Comparative example B |
|---|---|---|---|
| Average particle size (D50) | μm | 13 | — |
| Impurity contents | | | |
| Al | ppm | 2450 | 43 |
| Fe | ppm | 64 | 9 |
| Ca | ppm | 48 | 5 |
| Mg | ppm | 46 | 0.6 |
| Na | ppm | 44 | 12.6 |
| K | ppm | 63 | 5.8 |
| Alkali metal total | ppm | 107 | 18.4 |
| Circularity | | 0.95 | — |
| Crystallization ratio | % | 100 | 0 |

In Working Example A of the present invention, the circularity was 0.95 and the crystallization ratio was 100%. Note that the form of the crystal was cristobalite.

In Comparative Example B, the aluminum content was less than the present invention in range, no crystal peaks could be confirmed by X-ray diffraction, and only amorphous peaks could be confirmed. That is, the crystallization ratio was 0%. Regarding the circularity, the particles ended up aggregating with each other and the circularity could not be measured for individual particles.

Next, starting material silica powders having the same average particle sizes and impurity contents were flame sprayed to prepare spherical silica particles. After that, the obtained spherical silica particles were treated under different heat treatment temperatures (holding temperatures). The results are shown in Table 3. The temperature elevation rate, holding time period, and temperature descent rate other than the holding temperature were the same conditions as explained above.

As shown in Table 3, when treated at 1100 to 1300° C. (C1 to C3), the circularity was 0.92 or more and the crystallization ratio was 91% or more. Note that the crystal form was cristobalite.

The sample held at 1000° C. (C4) had a low crystallization ratio of 11%.

TABLE 3

Results of Heat Treatment (Holding) While Changing Holding Temperature

| No. | | Working example C1 | Working example C2 | Working example C3 | Comparative example C4 |
|---|---|---|---|---|---|
| Heat treatment temperature | | 1100 | 1200 | 1300 | 1000 |
| Impurity contents | | | | | |
| Al | ppm | 4350 | 4320 | 4300 | 4410 |
| Fe | ppm | 310 | 309 | 308 | 310 |
| Ca | ppm | 70 | 66 | 65 | 71 |
| Mg | ppm | 58 | 57 | 49 | 60 |
| Na | ppm | 181 | 175 | 161 | 183 |
| K | ppm | 190 | 181 | 180 | 191 |
| Alkali metal total | ppm | 371 | 356 | 341 | 374 |
| Circularity | | 0.92 | 0.93 | 0.92 | 0.93 |
| Crystallization ratio | % | 91 | 93 | 94 | 11 |

Working Example 2

Starting material silica powder with different Al contents were flame sprayed to obtain spherical particles. These were heat treated (held) under the same conditions as Working Example 1. The results are shown in Table 4.

The true specific gravity was measured using an AccupycII 1340 made by Micromeritics by the gas substitution method.

The ratio of crystal phases and the half value of the main peak of cristobalite were measured using a RINT-TTRIII made by Rigaku for the XRD apparatus under conditions of a Cu tube, a tube voltage of 50 kV, a tube current 300 mA, a divergence slit ½°, a scattering slit 8 mm, light receiving slit 13 mm, scan speed 2°/min, and sampling width 0.01°.

The phase transition start temperature was measured by a SETSYS Evolution differential heat analyzer made by SETARAM Instrumentation.

Samples having 400 ppm or more of Al all crystallized, while samples having less than 400 ppm failed to crystallize. Further, samples having 5000 ppm or more of Al agglomerated making it impossible to obtain spherical particles. Samples having an average particle size of less than 1 μm also agglomerated making it impossible to obtain spherical particles.

Further, samples including 80% or more of crystal phases all had phase transition temperatures of 219° C. or more.

TABLE 4

Results of Heat Treatment (Holding) While Changing Al Content

| | | Comp. ex. D1 | Comp. ex. D2 | Comp. ex. D3 | Working ex. D4 | Working ex. D5 | Ex. D6 |
|---|---|---|---|---|---|---|---|
| Average particle size (D50) | μm | 12.3 | 32.7 | 32.4 | 29.3 | 30.6 | 26.0 |
| Specific surface area | m$^2$/g | 0.39 | 0.21 | 0.25 | 0.28 | 0.27 | 0.27 |
| True specific gravity | | — | 2.20 | 2.21 | 2.22 | 2.21 | 2.21 |
| Circularity | | — | 0.969 | 0.911 | 0.906 | 0.941 | 0.929 | 0.910 |

TABLE 4-continued

Results of Heat Treatment (Holding) While Changing Al Content

Chemical ingredients

| | | | | | | | |
|---|---|---|---|---|---|---|---|
| Al | ppm | 43 | 79 | 122 | 521 | 544 | 1.085 |
| Fe | ppm | 9 | 6 | 10 | 7 | 9 | 7 |
| Ca | ppm | 5 | 10 | 17 | 4 | 11 | 21 |
| Mg | ppm | 1 | 1 | 2 | 1 | 10 | 16 |
| Na | ppm | 13 | 21 | 27 | 6 | 16 | 20 |
| K | ppm | 6 | 9 | 17 | 5 | 12 | 9 |
| Alkali metal total | ppm | 18 | 30 | 43 | 11 | 29 | 29 |

Ratio of crystal phases (including amorphous)

| | | | | | | | |
|---|---|---|---|---|---|---|---|
| Tridymite | % | — | — | — | 2.4 | 1.5 | 1.9 |
| Quartz | % | — | — | — | 1.3 | 0.5 | 0.4 |
| Cristobalite | % | — | — | — | 96.3 | 98.0 | 97.7 |
| Amorphous | % | 100 | 100 | 100 | 13 | 0 | 0 |
| α-Cristobalite main peak XRD half value, FWHM | deg (2θ) | — | — | — | 0.193 | 0.141 | 0.151 |
| Circularity | | 0.965 | 0.899 | 0.900 | 0.929 | 0.902 | 0.909 |
| True specific gravity | | 2.20 | 2.21 | 2.22 | 2.27 | 2.33 | 2.30 |
| Phase transition start temperature | °C. | — | — | — | 219 | 239 | 243 |

| | | Ex. D7 | Ex. D8 | Ex. D9 | Comp. ex. D10 | Comp. ex. D11 |
|---|---|---|---|---|---|---|
| Average particle size (D50) | μm | 76.0 | 13.1 | 4.9 | 18.0 | 0.5 |
| Specific surface area | m²/g | 0.12 | 0.44 | 0.70 | 0.38 | 6.80 |
| True specific gravity | | 2.21 | 2.21 | 2.21 | 2.21 | 2.21 |
| Circularity | | 0.901 | 0.978 | 0.911 | 0.943 | 0.920 |

Chemical ingredients

| | | | | | | |
|---|---|---|---|---|---|---|
| Al | ppm | 1.870 | 2.450 | 4.020 | 5.370 | 409 |
| Fe | ppm | 12 | 64 | 29 | 103 | 182 |
| Ca | ppm | 31 | 48 | 46 | 61 | 44 |
| Mg | ppm | 27 | 46 | 49 | 41 | 38 |
| Na | ppm | 31 | 44 | 27 | 78 | 12 |
| K | ppm | 19 | 63 | 22 | 91 | 11 |
| Alkali metal total | ppm | 50 | 107 | 49 | 169 | 23 |

Ratio of crystal phases (including amorphous)

| | | | | | | |
|---|---|---|---|---|---|---|
| Tridymite | % | 1.7 | 1.6 | 2.4 | 3.1 | 1.4 |
| Quartz | % | 0.2 | 0.9 | 0.6 | 0.3 | 0.0 |
| Cristobalite | % | 98.1 | 97.5 | 97.0 | 96.6 | 98.4 |
| Amorphous | % | 0 | 0 | 0 | 0 | 0 |
| α-Cristobalite main peak XRD half value, FWHM | deg (2θ) | 0.171 | 0.161 | 0.139 | 0.131 | 0.151 |
| Circularity | | 0.899 | 0.951 | 0.882 | Coagulated | Coagulated |
| True specific gravity | | 2.32 | 2.32 | 2.33 | 2.33 | 2.31 |
| Phase transition start temperature | °C. | 238 | 242 | 245 | 250 | 247 |

Example 3

Spherical silica particles with an Al content of 910 ppm were heat treated (held) while changing the temperature. The results are shown in Table 5. The heat treatment was performed by raising the temperature in the atmosphere by a temperature elevation rate of 100° C./hr up to a predetermined temperature, holding there for 6 hours, then cooling by a temperature descent rate of 100° C./hr down to ordinary temperature. The obtained silica particles fell in ratio of amorphous phases as the temperature of the heat treatment was raised. In the case of a holding time of 6 hours, samples with a heat treatment (holding) temperature of over 1280° C. and containing 80% or more of crystal phases were obtained. Samples with 20% or more of amorphous phases and less than 80% of crystal phases had phase transition temperatures of 223° C. or less, while samples containing 80% or more of crystal phases all had phase transition temperatures of 225° C. or more.

Figure 1:
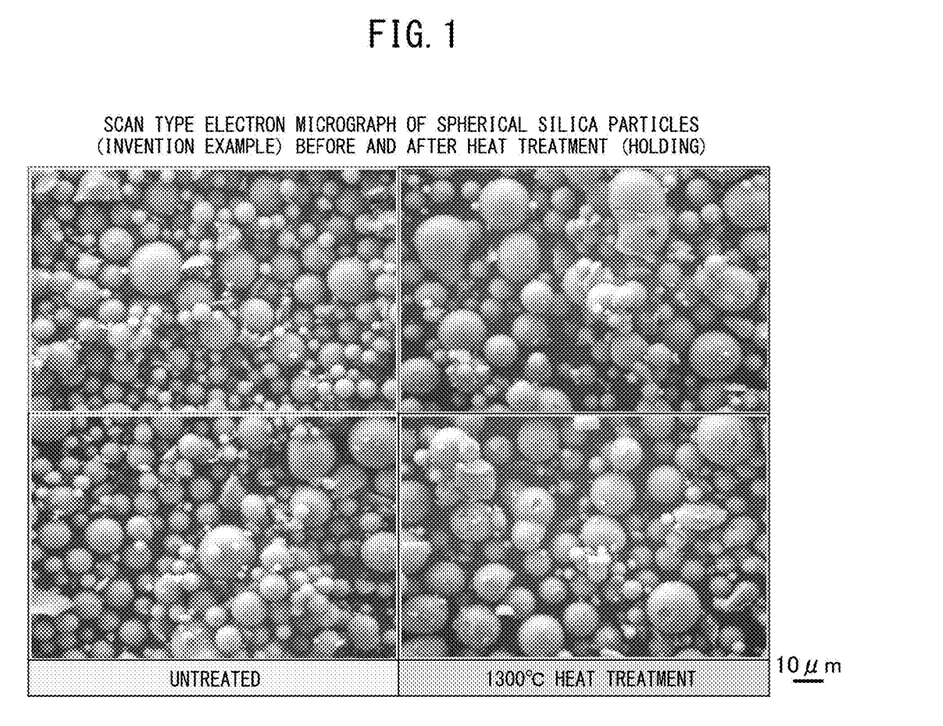
FIG. 1 is a scan type electron micrograph of spherical silica particles (working example) before and after heat treatment (holding).
Figure 2:
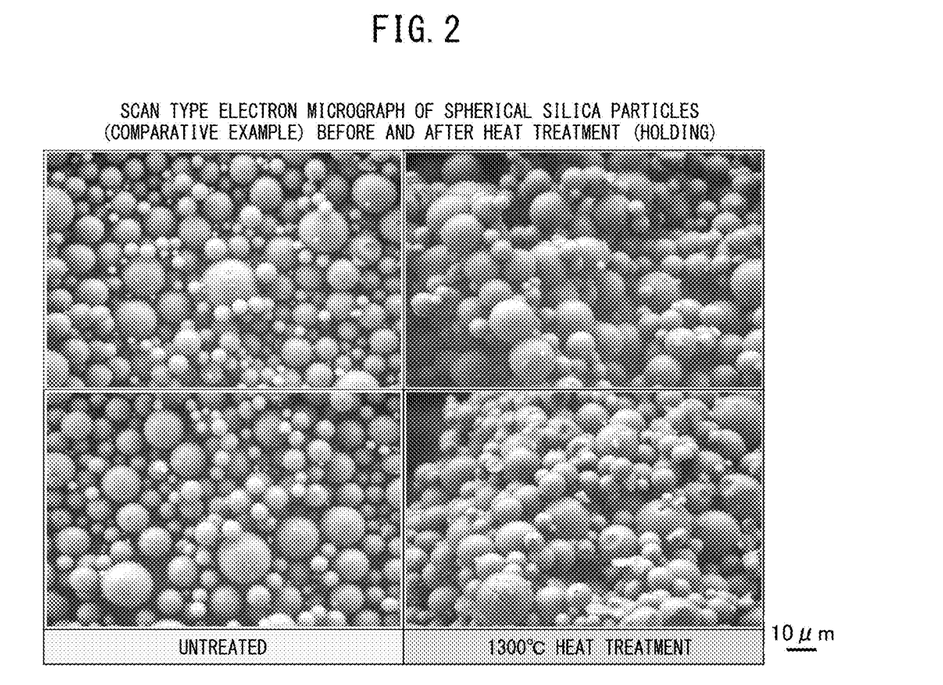
FIG. 2 is a scan type electron micrograph of spherical silica particles (comparative example) before and after heat treatment (holding).
Figure 3:
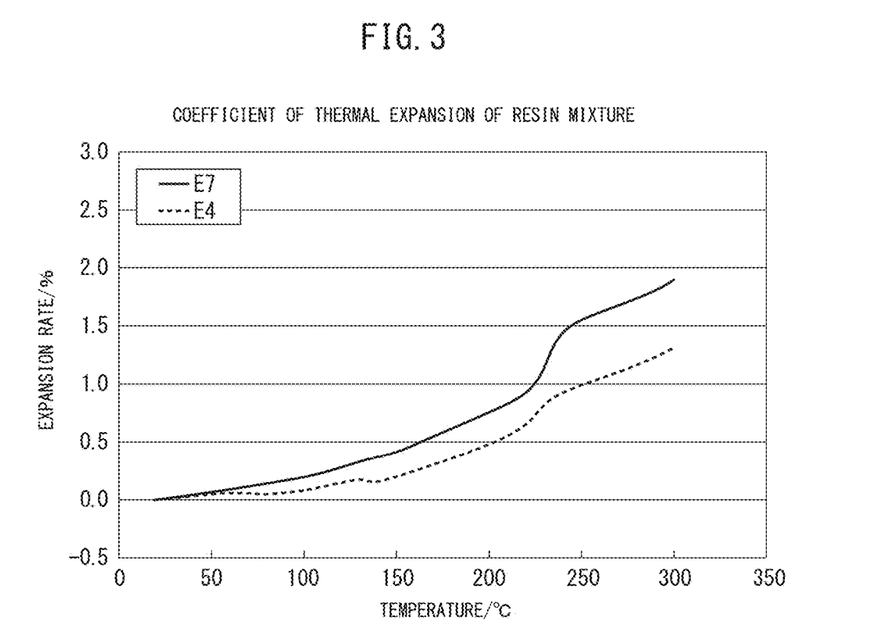
FIG. 3 is a graph of the coefficient of thermal expansion of resin mixtures of silica particles of a working example and comparative example.

Further, the sample E4 and sample E7 were mixed with a cresol novolac-based epoxy resin, curing agent, curing accelerator, release agent, and silane coupling agent to 82 wt % of the whole and were shaped and cured at a φ10×13 mm size at 200° C. to prepare samples which were then measured for coefficient of thermal expansion. The coefficient of thermal expansion was measured using a contact type heat expansion system at a temperature from room temperature to 300° C. As shown in FIG. 3, in the sample E4 with a ratio of crystal phases of less than 80%, the coefficient of thermal expansion increased by a substantially constant ratio, while in the sample E7 with a ratio of crystal phases of 100%, the coefficient of thermal expansion greatly rose from near 230° C. the same as the phase transition start temperature.

TABLE 5

Results of Heat Treatment (Holding) While Changing Holding Temperature

|  |  | Comp. ex. E1 | Comp. ex. E2 | Comp. ex. E3 | Comp. ex. E4 | Working ex. E5 | Working ex. E6 | Working ex. E7 | Working ex. E8 |
|---|---|---|---|---|---|---|---|---|---|
| Heat treatment temperature | °C. | 1250 | 1260 | 1270 | 1280 | 1285 | 1290 | 1300 | 1310 |
| Ratio of crystal phases (including amorphous) |  |  |  |  |  |  |  |  |  |
| Tridymite | % | 3.2 | 0.0 | 1.9 | 1.8 | 4.1 | 3.6 | 1.7 | 1.2 |
| Quartz | % | 3.1 | 2.4 | 0.4 | 0.9 | 1.3 | 0.2 | 0.3 | 0.2 |
| Cristobalite | % | 93.7 | 97.6 | 97.8 | 97.3 | 94.6 | 96.2 | 98.0 | 98.6 |
| Amorphous | % | 57.9 | 51.8 | 31.2 | 20.1 | 9.7 | 0.0 | 0.0 | 0.0 |
| α-Cristobalite main peak |  |  |  |  |  |  |  |  |  |
| XRD half value, FWHM | deg (2θ) | 0.261 | 0.250 | 0.211 | 0.208 | 0.190 | 0.181 | 0.171 | 0.160 |
| Circularity |  | 0.977 | 0.979 | 0.971 | 0.97 | 0.961 | 0.956 | 0.960 | 0.955 |
| True specific gravity |  | 2.22 | 2.22 | 2.24 | 2.25 | 2.26 | 2.28 | 2.30 | 2.32 |
| Phase transition start temperature | °C. | 215 | 219 | 219 | 223 | 225 | 227 | 229 | 236 |

|  |  | Working ex. E9 | Working ex. E10 | Working ex. E11 | Working ex. E12 | Working ex. E13 | Working ex. E14 | Working ex. E15 |
|---|---|---|---|---|---|---|---|---|
| Heat treatment temperature | °C. | 1320 | 1350 | 1400 | 1450 | 1500 | 1550 | 1600 |
| Ratio of crystal phases (including amorphous) |  |  |  |  |  |  |  |  |
| Tridymite | % | 0.8 | 0.1 | 0.0 | 0.1 | 0.0 | 0.0 | 0.0 |
| Quartz | % | 0.1 | 98.7 | 98.8 | 98.6 | 99.1 | 98.9 | 99.0 |
| Cristobalite | % | 99.0 | 1.2 | 1.2 | 1.3 | 0.9 | 1.1 | 1.0 |
| Amorphous | % | 0.0 | 0.0 | 0.0 | 0.0 | 0.0 | 0.0 | 0.0 |
| α-Cristobalite main peak |  |  |  |  |  |  |  |  |
| XRD half value, FWHM | deg (2θ) | 0.156 | 0.139 | 0.134 | 0.132 | 0.133 | 0.135 | 0.131 |
| Circularity |  | 0.952 | 0.949 | 0.946 | 0.946 | 0.946 | 0.948 | 0.947 |
| True specific gravity |  | 2.33 | 2.34 | 2.34 | 2.34 | 2.34 | 2.34 | 2.34 |
| Phase transition start temperature | °C. | 241 | 248 | 250 | 250 | 251 | 251 | 251 |

Example 4

Filler with an Al content of 544 ppm was heat treated (held) at 1300° C. while changing the holding time period. The results are shown in Table 6. The ratio of the amorphous phases fell as the holding time period became longer. If the heat treatment (holding) temperature is 1300° C., at a holding time of 3.5 hours, a sample containing 80% or more of crystal phases was obtained. Samples having 80% or more of crystal phases all had phase transition temperatures of 225° C. or more.

TABLE 6

Results of Heat Treatment (Holding) While Changing Holding Time

|  |  | Comp. ex. F1 | Comp. ex. F2 | Comp. ex. F3 | Working ex. F4 | Working ex. F5 | Working ex. F6 | Working ex. F7 |
|---|---|---|---|---|---|---|---|---|
| Heat treatment time period | h | 1 | 2 | 3 | 4 | 6 | 8 | 12 |
| Ratio of crystal phases (including amorphous) |  |  |  |  |  |  |  |  |
| Tridymite | % | 9.4 | 0.9 | 1.3 | 1.5 | 1.7 | 1.1 | 0.8 |
| Quartz | % | 16.8 | 0.9 | 0.0 | 0.1 | 0.3 | 0.1 | 0.2 |
| Cristobalite | % | 73.8 | 98.2 | 98.7 | 98.4 | 98.0 | 98.8 | 99.0 |
| Amorphous | % | 51.2 | 25.6 | 20.1 | 18.4 | 0.0 | 0.0 | 0.0 |
| α-Cristobalite main peak |  |  |  |  |  |  |  |  |
| XRD half value, FWHM | deg (2θ) | 0.223 | 0.188 | 0.176 | 0.174 | 0.171 | 0.159 | 0.160 |
| Circularity |  | 0.967 | 0.959 | 0.959 |  | 0.960 | 0.952 | 0.956 |
| True specific gravity |  | 2.23 | 2.26 | 2.28 | 2.28 | 2.30 | 2.33 | 2.33 |
| Phase transition start temperature | °C | 220 | 233 | 231 | 225 | 229 | 239 | 239 |

Example 5

Filler with an Al content of 431 ppm was heat treated (held) for a holding time period of 6 hours while changing the temperature. The results are shown in Table 7. At 1250° C. or less, the ratio of amorphous phases was a large 40% or more and no phase transition occurred. As opposed to this, at 1260° C. or more, the ratio of amorphous phases became 20% or less. It was confirmed that phase transition occurred. The presence of phase transition was judged by the presence of a peak at the DTA chart.

TABLE 7

Results of Heat Treatment (Holding) While Changing Temperature

|  | Comp. ex. G1 | Comp. ex. G2 | Working ex. G3 | Working ex. G4 |
|---|---|---|---|---|
| Heat treatment temperature (° C.) | 1240 | 1250 | 1260 | 1270 |
| Holding time period (h) | 6 | 6 | 6 | 6 |
| Quartz (%) | 10.7 | 3.2 | 4.6 | 1.0 |
| Cristobalite (%) | 89.3 | 95.5 | 94.5 | 97.7 |
| Tridymite (%) | 0.0 | 1.3 | 0.9 | 1.2 |
| Amorphous (%) | 84.0 | 40.6 | 18.9 | 0.0 |
| α-Cristobalite main peak |  |  |  |  |
| XRD half value, FWHM (deg) | 0.151 | 0.220 | 0.199 | 0.193 |
| Circularity | 0.92 | 0.91 | 0.89 | 0.88 |
| True specific gravity | 2.24 | 2.25 | 2.28 | 2.30 |
| DTA | — | — | 217 | 219 |

The invention claimed is:

1. Spherical crystalline silica particles containing 400 to 5000 ppm of aluminum, containing 80% or more of crystal phases, and containing 20 to 300 ppm of an alkali metal, wherein the alkali metal is selected from the group consisting of lithium, sodium, potassium, rubidium, cesium and francium.

2. The spherical crystalline silica particles according to claim 1, containing 90% or more of crystal phases.

3. The spherical crystalline silica particles according to claim 1, wherein 95 to 100% of the crystal phases are cristobalite crystal phases.

4. The spherical crystalline silica particles according to claim 1, wherein the cristobalite crystal phases have a phase transition start temperature of 220 to 245° C.

5. The spherical crystalline silica particles according to claim 1, wherein an average particle size (D50) is 1 to 100 μm.

6. The spherical crystalline silica particles according to claim 1, containing 29 to 300 ppm of the alkali metal.

7. A process of production of spherical crystalline silica particles comprising:
preparing silica powder so as to contain 400 to 5000 ppm of aluminum and contain 20 to 300 ppm of an alkali metal,
flame spraying the prepared silica powder,
holding the flame sprayed spherical silica particles at 1100 to 1600° C. for 1 to 12 hours, and
cooling the spherical silica particles to have 80% or more of crystal phases,
wherein the alkali metal is selected from the group consisting of lithium, sodium, potassium, rubidium, cesium and francium.

8. The process of production according to claim 7, wherein the flame sprayed spherical silica particles have an average particle size (D50) of 1 to 100 μm.

9. The process of production according to claim 7, comprising preparing said silica powder so as to contain 29 to 300 ppm of the alkali metal.

* * * * *